United States Patent
Shimoyama et al.

(10) Patent No.: US 7,557,007 B2
(45) Date of Patent: Jul. 7, 2009

(54) METHOD FOR MANUFACTURING SEMICONDUCTOR DEVICE

(75) Inventors: Kazuo Shimoyama, Nagano (JP);
Mutsumi Kitamura, Nagano (JP);
Hongfei Lu, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 54 days.

(21) Appl. No.: 11/321,453

(22) Filed: Dec. 30, 2005

(65) Prior Publication Data

US 2006/0166419 A1 Jul. 27, 2006

(30) Foreign Application Priority Data

Jan. 21, 2005 (JP) ............... 2005-013588

(51) Int. Cl.
*H01L 21/336* (2006.01)
(52) U.S. Cl. .................. 438/270; 257/E29.133; 257/E21.155
(58) Field of Classification Search ............. 438/173, 438/270, 272, 267, 301, 407, 423, 433, 434, 438/440, 449
See application file for complete search history.

(56) References Cited

U.S. PATENT DOCUMENTS

| 4,652,334 | A  | * | 3/1987 | Jain et al. ............ 438/756 |
| 6,258,697 | B1 | * | 7/2001 | Bhakta et al. ........ 438/437 |
| 6,319,861 | B1 | * | 11/2001 | Shih et al. ........... 438/798 |
| 6,448,139 | B2 | * | 9/2002 | Ito et al. ............. 438/270 |
| 6,551,881 | B1 | * | 4/2003 | Letavic .............. 438/267 |
| 6,750,116 | B1 | * | 6/2004 | Chen ................ 438/434 |
| 6,821,844 | B2 | * | 11/2004 | Hsu ................. 438/246 |
| 6,953,722 | B2 | * | 10/2005 | Seidl et al. .......... 438/240 |
| 7,074,672 | B2 | * | 7/2006 | Kianian et al. ....... 438/257 |
| 2003/0235959 | A1 |  | 12/2003 | Lichtenberger et al. |

OTHER PUBLICATIONS

Candelier et al. "Simplified 0.35- m Flash EEPROM Process Using High-Temperature Oxide (HTO) Deposited by LPCVD as Interpoly Dielectrics and Peripheral Transistors Gate Oxide", IEEE Electron Device Letters, vol. 18, No. 7, Jul. 1997.*
Liu et al. "HF wet etching of oxide after ion implantation." Electron Devices Meeting, 1996, IEEE Hong Kong, Jun. 29, 1996, p. 17-20.*
C. Dominguez, B. Garrido, J. Montserrat, J. R. Morante and J. Samitier, "Etching rate modification in $SiO_2$ by ion implantation and thermal annealing." Nuclear Instruments and Methods in Physics Research, B80/81 (1993) pp. 1367-1370.

* cited by examiner

*Primary Examiner*—W. David Coleman
*Assistant Examiner*—Shaka Scarlett
(74) *Attorney, Agent, or Firm*—Rabin & Berdo, P.C.

(57) ABSTRACT

The method for manufacturing a semiconductor device according to the invention includes forming a thick silicon oxide film uniformly in a trench. Argon ions or the like implanted obliquely into the trench to form an ion implanted damaged region selectively in the portion of the silicon oxide film on the trench sidewall utilizing the shadowing effects of the oblique ion implantation. The silicon oxide film is wet etched to selectively remove the silicon oxide film in the ion implanted damaged region utilizing the etching rate difference, wherein the etching rate is faster in the damaged region than in the undamaged region. As a result, a thick residual oxide film is formed on the bottom and the lower sidewall portion of the trench without causing any bird's beak.

13 Claims, 11 Drawing Sheets

METHOD FOR MANUFACTURING SEMICONDUCTOR DEVICE

CROSS-REFERENCE TO RELATED APPLICATION

This application claims foreign priority benefits under 35 USC 119 of Japanese Patent Application Serial No. 2005-013588, the entire disclosure of which is incorporated herein by reference.

FIELD OF THE INVENTION

The invention relates to a method for manufacturing a semiconductor device that includes a trench-type device having a semiconductor substrate, trenches formed in the substrate, and gate insulator layers formed on the bottom and the sidewall of the trenches. Specifically, the invention relates to a method for forming a thick oxide film on some areas in the trench in manufacturing trench-type semiconductor devices, having the gates thereof in the trenches, such as metal oxide semiconductor field effect transistors (hereinafter referred to as "MOSFETs"), insulated gate bipolar transistors (hereinafter referred to as "IGBTs") and such trench MOS devices.

BACKGROUND OF THE INVENTION

Although semiconductor apparatuses integrating power MOS devices for the switching devices thereof are used for switching power supply ICs and driver ICs mounted on hand held electronic equipment and data communication equipment, on-resistance reduction and switching characteristics improvement for the power MOS devices pose problems which should be obviated. First, a trench lateral power MOS device (a trench lateral power MOSFET: hereinafter referred to simply as a "TLPM"), which integrates switching devices including trenches therein with high integration density and exhibits low on-resistance, will be described below.

The TLPM has been attracting much attention, since the TLPM has achieved low on-resistance (60% as high as the on-resistance of the conventional lateral planar power MOS device) by shortening the device pitch and increasing the channel width density, and since the TLPM has realized excellent switching characteristics by reducing the feedback capacitance and the channel capacitance thereof.

FIG. 9 is a cross-sectional view of a TLPM employing a conventional technique.

Referring to FIG. 9, the conventional TLPM 1 includes a p$^-$-type semiconductor substrate 1, a trench 11 formed from the surface of semiconductor substrate 1, an n-type drain region 12 surrounding the sidewall and the bottom of trench 11, and an n-type plug region 13 formed in the bottom of trench 11. TLPM 1 further includes an n$^+$-type source region 14 formed in a p-type offset region 15 around the upper portion of trench 11.

Source electrodes 16 are formed around the aperture of trench 1. A drain electrode 17 is formed on the surface of semiconductor substrate 1 between source electrodes 16. A polysilicon gate electrode 19 is formed in trench 11 such that gate electrode 19 is facing toward p-type offset region 15 across a gate oxide film 18. A polysilicon drain connection conductor 20 connects n-type drain region 12 and drain electrode 17 to each other. Gate electrode 19, drain connection conductor 20 and a source connection conductor 21 are insulated from each other by an insulator film 22 formed into a unit with gate oxide film 18.

It is important for the process of manufacturing TLPM 10 to form a silicon oxide ($SiO_2$) film selectively in the bottom of trench 11 or to form the oxide film to be thicker on the bottom of trench 11 than on the sidewall of trench 11. In these days, techniques for manufacturing a trench MOS device are known. The techniques facilitate reducing the capacitance between the gate and drain (Cgd) by the discriminative oxidation using the shadowing effects obtained by oblique ion implantation and providing the trench MOS device with high mutual inductance (gm, max.) and low on-resistance important for optimal amplification and switching of linear signals (cf. U.S. Patent Specification 2003/0235959 A).

FIGS. 10A through 10C are cross-sectional views illustrating the steps for selectively forming an oxide film in a trench. N$^+$ ions (nitrogen ions) are implanted obliquely only into silicon in the sidewall of a trench 100 so that ion implantation into the bottom of trench 100 may be avoided (cf. the oblique nitrogen ion implantation shown in FIG. 10A). By the oblique nitrogen ion implantation, an oxidation-resistive mask region 101 of nitrogen-doped silicon or a silicon nitride film is formed in the sidewall of trench 100. As a result, oxidation-resistive mask region 101 distributes as shown in FIG. 10B. In the subsequent thermal oxidation, an insulator layer grows slowly in oxidation-resistive mask region 101, in which N$^+$ ions have been implanted. By using this, an oxide film 102 in the trench bottom may be made to be thicker than the not shown oxide film formed in the sidewall of trench 100 (cf. FIG. 10C).

The method for forming an oxide film as described above is different from the usual method, which forms various oxide films over the entire surface and, then, removes the unnecessary oxide films by etching. The above-described method for oxide film formation is the so-called local oxidation of silicon (hereinafter, referred to simply as the "LOCOS") that grows an oxide film locally (selectively) on a silicon wafer. The LOCOS is used to form a field oxide film for device separation. Growth of a LOCOS oxide film adjacent to a nitride film sometimes exhibits the effects called "encroachment".

FIGS. 11A and 11B are cross-sectional views illustrating the steps of selective oxidation using a nitrogen-doped silicon film or a nitride film for an oxidation-resistive mask. In the planar process, a nitrogen-doped silicon film or a silicon nitride ($Si_3N_4$) film is arranged locally on a silicon wafer 110 for an oxidation-resistive mask 111. A thin silicon oxide film 112 is disposed below oxidation-resistive mask 111. Then, silicon oxide film 112 is oxidized selectively as shown in FIG. 11B. Since silicon wafer 110 is oxidized simultaneously with the selective oxidation of silicon oxide film 112, a LOCOS oxide film 113 is formed as shown in FIG. 11B. As LOCOS oxide film 113 is formed, silicon oxide film 112 is grown and expanded on the major surface of silicon wafer 110 and oxidation-resistive mask 111 is lifted somewhat from silicon wafer 110. Due to the lifting of oxidation-resistive mask 111, LOCOS oxide film 113 is shaped with the so-called "bird's beak" below the edge portion of oxidation-resistive mask 111.

The trouble due to the bird's beak shape is caused also in oxide film 102 in the trench bottom shown in FIG. 10C. Oxide film 112 sinking below oxidation-resistive mask 111 exerts stress to the inside of silicon wafer 110, causing crystal defects therein.

Published U.S. Patent Specification 2003/0235959A describes the method for implanting Ar ions at a high dose amount vertically into a silicon wafer including trenches formed therein so that the Ar ions may be implanted only into the trench bottom and so that the implantation thereof into the trench sidewall may be avoided. Since the oxidation rate of silicon in the trench bottom is increased by the Ar ion implantation thereto, a thick oxide film may be formed in the trench bottom by the subsequent thermal oxidation process.

[Non-Patent Document 1] C. Dominguez, B. Garrido, J. Montserrat, J. R. Morante and J. Samitier, "Etching rate modification in $SiO_2$ by ion implantation and thermal annealing." Nuclear Instruments and Methods in Physics Research, B80/81 (1993) p.p. 1367-1370

Since the discriminative oxidation described in Published U.S. Patent Specification 2003/0235959A dopes the silicon layer around trench 100 directly with nitrogen by ion implantation, the nitrogen in oxidation-resistive mask region 101 of nitrogen-doped silicon, or of a nitride film, is sometimes not completely consumed by thermal oxidation. If the nitrogen-doped silicon remains in the trench sidewall, nitrogen will be left in the silicon layer without being expelled to the outside even by a heat treatment performed for a long time at a high temperature, since the bonding force between silicon and nitrogen is very strong. It has been known that the diffusion coefficient of boron (B), phosphorus (P) and such a dopant is reduced greatly in nitrogen-doped silicon. If nitrogen is doped locally in the trench sidewall, the device characteristics will be impaired due to a reduction of carrier mobility, stress generation and other such causes.

As shown in FIG. 11B, LOCOS oxide film 113 is shaped with a bird's beak below the edge portion of oxidation-resistive mask 111 by oxidant encroachment. If similar oxidant encroachment occurs in both edge portions of oxidation-resistive mask region 101 formed on the trench sidewall shown in FIGS. 10B and 10C, the resulting stress in the edge portions of oxidation-resistive mask region 101 will further cause crystal defects to occur or the flatness of the trench sidewall will be impaired.

A thick oxide film may be formed selectively in the lower portion of the trench sidewall or in the bottom of trench by thermal oxidation in a process for manufacturing a trench-type semiconductor device in which a nitrogen-doped silicon layer or a nitride film is formed for an oxidation-resistive mask by selectively implanting $N^+$ ions obliquely into the silicon layer around the trench sidewall. However, several adverse effects will occur, including for example, (1) the characteristics and reliability of the device will be impaired by the residual nitrogen, (2) crystal defects and stress will be caused by the oxidation, (3) the characteristics and the reliability of the device will be impaired also by stress resulting from formation of a bird's beak.

Since argon gas is inert and argon is electrically inactive in silicon, argon atoms may be expelled outside a silicon wafer by a high-temperature thermal treatment (out-diffusion). Therefore, argon ion implantation into the trench bottom is advantageous for reducing the concentrations of argon and such impurities.

When a silicon wafer, into which argon ions are implanted, is treated thermally, the argon gas condenses in the silicon wafer during the heat treatment, causing vacancy-type defects called "micro bubbles." The micro bubbles are liable to adsorb heavy metals, impairing the device characteristics. Thus, the micro bubbles also cause a troublesome reduction in carrier mobility.

In view of the foregoing, it would be desirable to provide a method for manufacturing a semiconductor device that facilitates forming a thick oxide film selectively and easily on the bottom of a trench and on the sidewall near the bottom of the trench.

SUMMARY OF THE INVENTION

According to the invention, there is provided a method for manufacturing a semiconductor device including the steps of:

forming a trench in a semiconductor substrate; forming a gate insulator film of predetermined thickness on the bottom and the sidewall of the trench; and partially removing the portion of the gate insulator film on the sidewall of the trench near the aperture thereof to selectively reduce the thickness of that portion of the gate insulator film.

Since a thick oxide film is formed relatively easily in the bottom of a trench or in or in both the bottom of a trench and on the sidewall of the trench near the bottom thereof, trench MOSFETs exhibiting a high breakdown voltage and trench IGBTs exhibiting a high breakdown voltage can be manufactured by the method of the invention.

DETAILED DESCRIPTION OF THE PREFERRED EMBODIMENTS

Now the invention will be described in detail hereinafter with reference to the accompanied drawing figures, which illustrate the preferred embodiments of the invention.

Figure 1A:
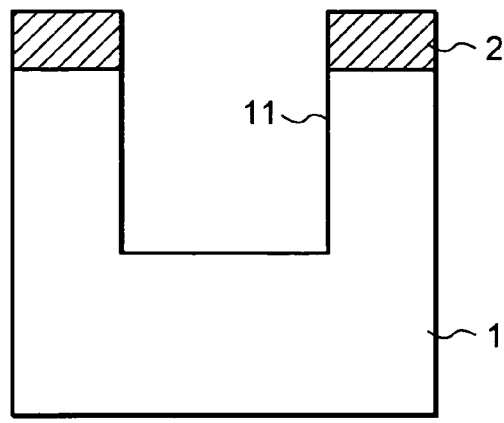
FIGS. 1A through 1C are cross-sectional views illustrating the steps for manufacturing a semiconductor device according to an embodiment of the invention.
Figure 1B:
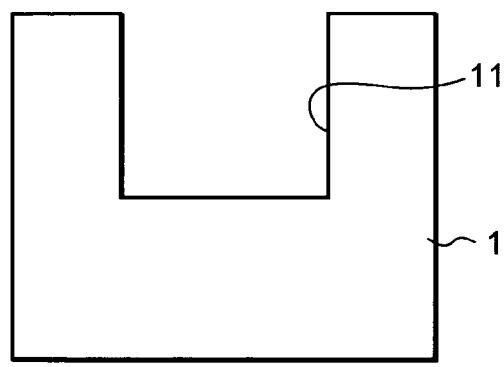
Figure 1C:
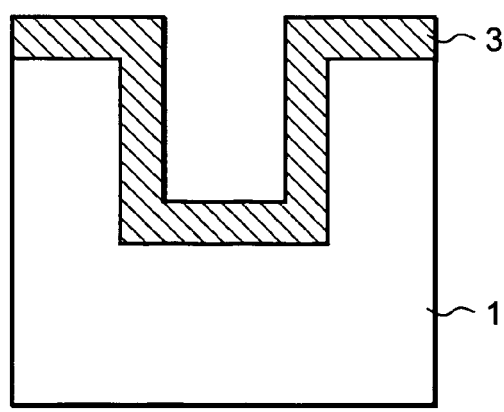
Figure 2A:
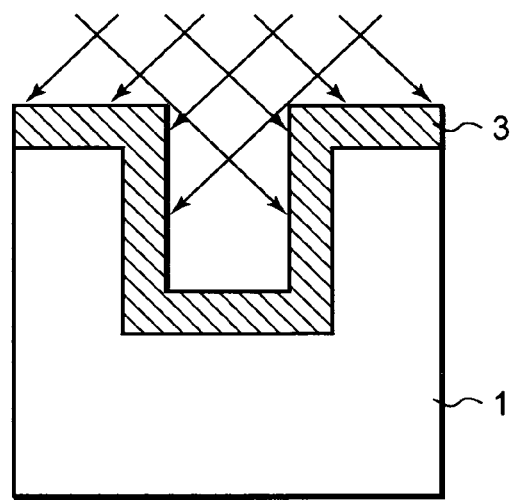
FIGS. 2A through 2C are cross-sectional views illustrating the steps, subsequent to the steps illustrated in FIGS. 1A through 1C, for manufacturing the semiconductor device according to the embodiment of the invention.
Figure 2B:
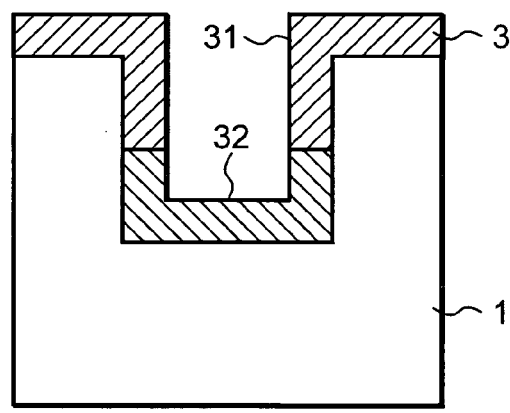
Figure 2C:
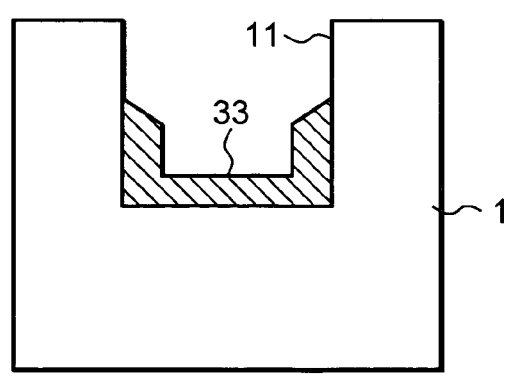

FIGS. 1A through 1C are cross-sectional views describing the steps for manufacturing a semiconductor device according to the embodiment of the invention. FIGS. 2A through 2C are cross-sectional views describing the steps, subsequent to the steps described in FIGS. 1A through 1C, for manufacturing the semiconductor device according to the embodiment of the invention.

Referring now to FIG. 1A, an etching mask 2 is formed on a semiconductor substrate 1 such as a silicon wafer. Then, a trench 11 having a predetermined width and a predetermined depth is formed by etching semiconductor substrate 1. Etching mask 2 is a silicon oxide film or a silicon nitride film shaped by a photoresist with a predetermined shape (the step (a)). Referring now to FIG. 1B, the silicon oxide film used for mask 2 is removed entirely (step (b)). Referring now to FIG. 1C, a silicon oxide film 3 is formed uniformly on the major surface of semiconductor substrate 1 and on the inner surface of trench 11 (step (c)).

Silicon oxide film 3 is a silicon oxide film formed by thermally oxidizing silicon, a high-temperature oxide film (hereinafter referred to as an "HTO film") formed by low-pressure chemical vapor deposition (LP-CVD: hereinafter referred to simply as "CVD"), a tetraethyl orthosilicate film (hereinafter referred to simply as a "TEOS film"), or an appropriate combination of these films.

Referring now to FIG. 2A, argon ions are implanted into silicon oxide film 3 in an ion implantation installation. The argon ion implantation angle is adjusted as shown in FIG. 2A so as not to irradiate any argon ion onto the portion of silicon oxide film 3 to be left unremoved (step (d)). Referring now to FIG. 2B, an implanted damaged region 31 is formed only on the major surface of semiconductor substrate 1 and the upper sidewall portion of trench 11 near the aperture thereof. Implanted damaged region 31 is a region, in which the network structure in silicon oxide film 3 is damaged by the ion implantation. The portions of silicon oxide film 3 on the lower sidewall portion and the bottom of trench 11 remain as an undamaged region 32 (step (e)).

Then, semiconductor substrate 1 with implanted damaged region 31 formed therein is etched to remove a part of silicon oxide film 3. All the portions of silicon oxide film 3 in implanted damaged region 31 may be removed or the thickness of silicon oxide film 3 in implanted damaged region 31 may be reduced. Silicon oxide film 3 in implanted damaged region 31 is etched selectively by wet etching with aqueous solution of hydrogen fluoride (hydrofluoric acid). Finally, a relatively thick oxide film (a residual oxide film 33) is formed on the lower sidewall portion and the bottom of trench 11 as shown in FIG. 2C (step (f)).

The damage amount caused in silicon oxide film 3 and the distribution thereof are adjusted by selecting the ion species, the implantation energy and the implantation dose amount. The ion implantation may not be conducted always once collectively but conducted several times dividedly. For adjusting the thickness and the shape of residual oxide film 33, the implantation energy, the implantation dose amount, and the implantation angle may be changed at every ion implantation.

Any ion species that facilitates forming implanted damaged region 31 in silicon oxide film 3 may be used primarily. In addition to the argon ion described above, the hydrogen (H) ion, the helium (He) ion, the boron (B) ion, the phosphorus (P) ion and the arsenic (As) ion may be used. By selecting any of the inactive rare gas ion species, a damaged region may be formed in silicon oxide film 3 without fail even when the dose amount thereof is relatively small.

When ions of halogen atoms such as fluorine (F) ions, chlorine (Cl) ions, bromine (Br) ions, and iodine (I) ions are used, the halogen atoms react with silicon atoms during the heat treatment conducted in the manufacturing process, producing $SiCl_4$ and volatile halides of silicon such as $SiCl_4$, $SiF_4$, $SiBr_4$ and $SiI_4$. And, the volatile species are expelled outside the semiconductor substrate (out diffusion). Since the concentration of the excessive silicon atoms is reduced by the out diffusion, the dielectric breakdown voltage of silicon oxide film 3 and the reliability thereof are improved. Since the halogen atoms react with contaminant metal atoms and tend to form volatile salts, the halogen atoms implanted facilitate removing the contaminant metals.

As described above, thick residual silicon oxide film 33 is formed on the bottom of trench 11 and the lower sidewall portion of trench 11 near the bottom thereof in semiconductor substrate 1 through the steps of: forming thick silicon oxide film 3 uniformly in trench 11; forming implanted damaged region 31 selectively in the portion of silicon oxide film 3 on the trench sidewall utilizing the shadowing effects obtained by implanting Ar ions and such ions obliquely; and removing the silicon oxide film in implanted damaged region 31 in trench 11 selectively by the wet etching with a hydrofluoric acid aqueous solution utilizing the etching rate difference between the damaged region and the undamaged region, in which the etching rate is higher in the damaged region than in the undamaged region. Thus, a relatively thick oxide film is formed finally on the bottom of trench 11 or on the lower sidewall portion of trench 11 and the bottom thereof without causing any bird's beak.

According to the embodiment of the invention, residual silicon oxide film 33 that remains finally on the lower sidewall portion of trench 11 and the bottom thereof is obtained from a thick silicon oxide film formed in advance by thermal oxidation in trench 11. The thick silicon oxide film is formed simply and easily by the thermal oxidation.

A CVD oxide film such as a HTO film, obtained by oxidizing a silane source gas such as monosilane ($SiH_4$) and dichlorosilane ($SiH_2Cl_2$) on a silicon wafer, and a TEOS film, obtained by thermally decomposing tetraethoxyorthosilane on a silicon wafer, is used. By using the CVD oxide film described above, stress and crystal defects caused by the thermal oxidation of semiconductor substrate 1 are prevented from occurring and the silicon consumption in trench 11 is reduced. Therefore, the characteristics and the reliability of the device are improved by using the silicon oxide film formed by the CVD method.

The quality of the silicon oxide film is not good immediately after the CVD thereof. However, since the film quality is improved to the level of the thermal oxidation film by high-temperature annealing, it is desirable to conduct high-temperature annealing after the CVD treatment.

Figure 3A:
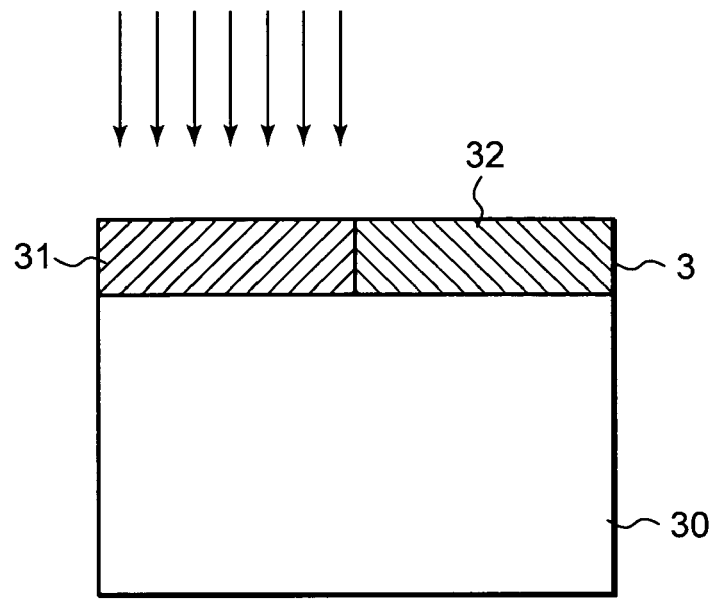
FIGS. 3A and 3B are schematic cross-sectional views useful for explaining the etching rate higher in the damaged region than in the undamaged region.
Figure 3B:
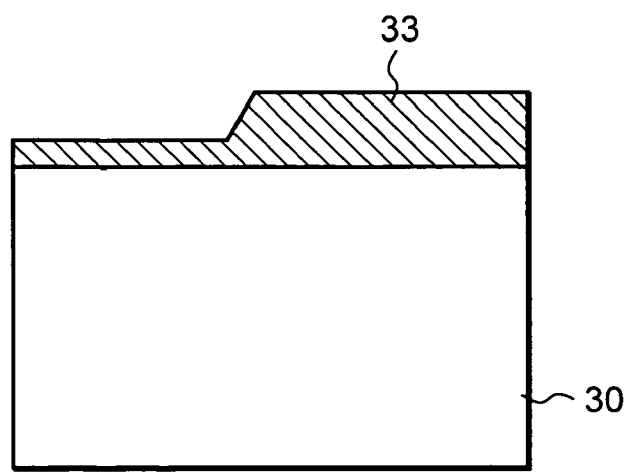

FIGS. 3A and 3(b) are schematic cross-sectional views explaining the etching rate higher in the damaged region than in the undamaged region. Here, explanations are made in connection with the damaged region formed in an oxide film by argon ion implantation in a planar process.

Referring now to FIG. 3A, implanted damaged region 31 is formed by implanting argon ions into a part of silicon film 3 formed on a silicon wafer 30. Silicon oxide film 3 including undamaged region 32 is etched by wet etching with a hydrofluoric acid aqueous solution. By the wet etching, residual oxide film 33 including a predetermined step is formed on silicon wafer 30 (cf. FIG. 3(b)).

It is well known to those skilled in the art that the damages caused in silicon oxide film 3 increase the etching rate for the wet etching with a hydrofluoric acid aqueous solution.

According to the invention, an oxide film is formed selectively in a trench by combining the etching rate increase described above and the shadowing effects obtained by implanting ions obliquely to the semiconductor substrate, in which trenches are formed. Since implanted damaged region 31 is not left after the manufacturing process is over according to the scheme described above, the device characteristics are not impaired but the device reliability is improved.

The etching rate increase, obtained in the implanted damaged region formed by implanting argon ions obliquely into a silicon oxide film, in the wet etching with a hydrofluoric acid aqueous solution is described in the Non-patent Document 1.

Figure 4:
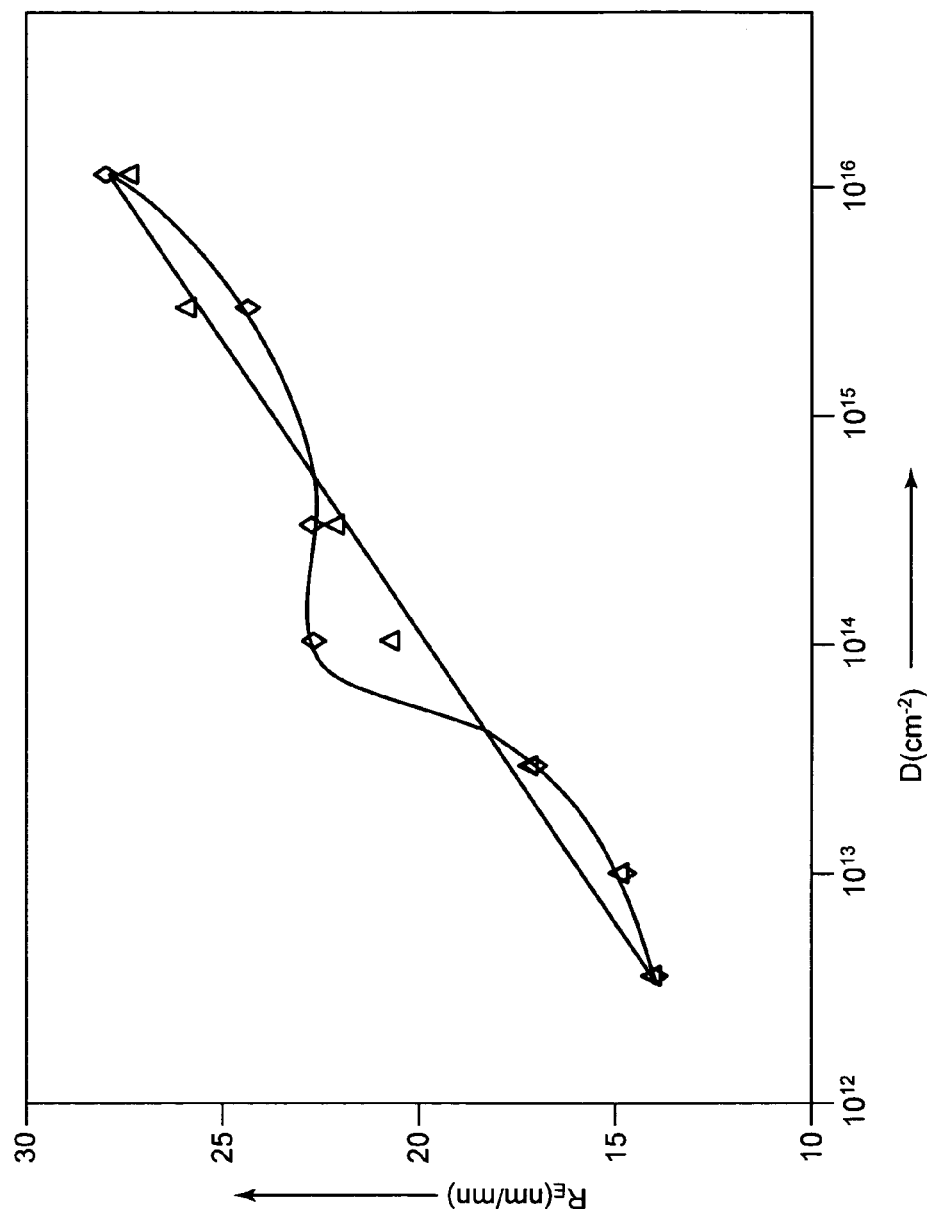
FIG. 4 is a pair of curves relating the etching rate, at which an oxide film is etched by wet etching, and the amount of an argon ion dose.

FIG. 4 is a pair of curves relating the etching rate, at which an oxide film is etched by wet etching, and the argon ion dose amount with each other. The characteristic figure that describes the dependence of the etching rate on the dose amount is reported in the Non-patent Document 1. The wet etching rate of the silicon oxide film, into which damages are caused by argon ion implantation, sometimes distributes in the depth direction and exhibits maximums at a shallow location and a deep location depending on the argon ion dose amount. The solid curve in FIG. 4 represents the maximum at the shallow location and the broken curve the maximum at the deep location. In FIG. 4, the horizontal axis represents the Ar implantation dose amount D (measured in ions/cm$^2$) and the vertical axis the etching rate $R_E$. As described in FIG. 4, the oxide film etching rate is higher as the Ar implantation dose amount, that is the amount of damages caused, is larger. Since the Ar distribution or the damage distribution in the oxide film varies depending on the implantation energy or the implantation dose amount, the thickness and the quality of the oxide film left after the wet etching are controlled by adjusting the implantation energy or the implantation dose amount considering the use of the device.

Figure 5A:
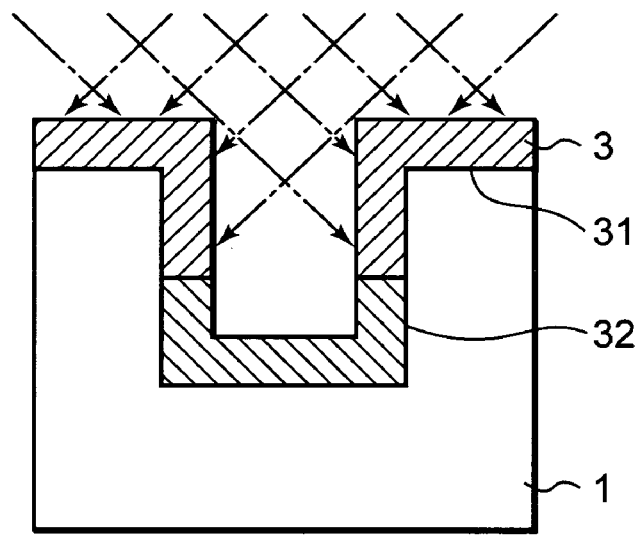
FIGS. 5A and 5B are schematic cross-sectional views showing an silicon oxide film into which ions are implanted at a high tilt angle in a trench.
Figure 5B:
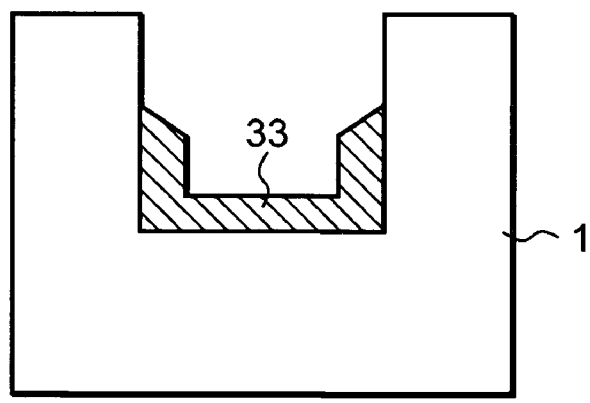

FIGS. 5A and 5(b) are schematic cross-sectional views showing an silicon oxide film, into which ions are implanted at a high tilt angle, in a trench. The tilt angle is the degrees of angle between the incident ion beam and the vertical line. As shown in FIGS. 5A and 5(b), a thick oxide film may be left not only on the trench bottom but also on the lower sidewall portion of the trench by forming a thick silicon oxide film 3 on semiconductor substrate 1 in advance and by implanting ions at a high tilt angle. In other words, the shape of residual oxide film 33 after etching is determined by selecting the tilt angle considering the trench shape and by forming implanted damaged region 31 based on the selected tilt angle.

Figure 6A:
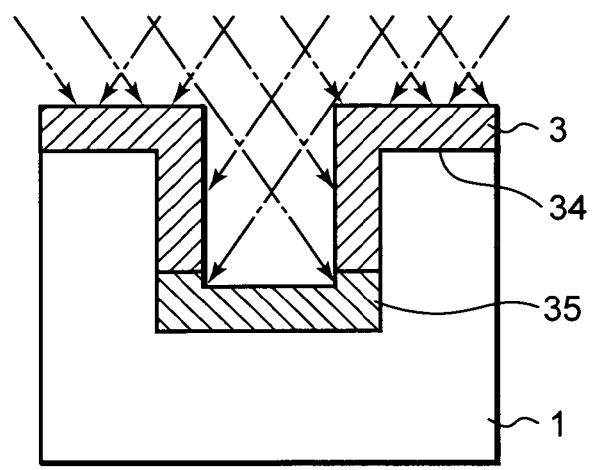
FIGS. 6A and 6B are schematic cross-sectional views showing an silicon oxide film into which ions are implanted at a low tilt angle in a trench.
Figure 6B:
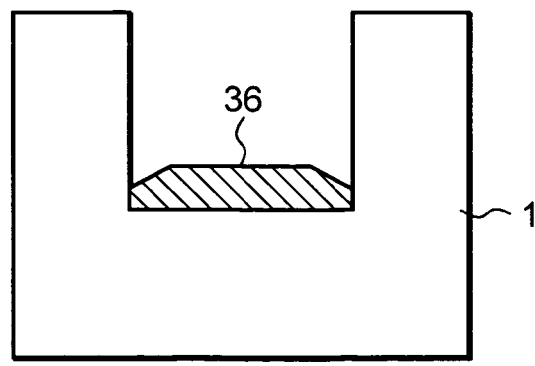

FIGS. 6A and 6(b) are schematic cross-sectional views showing an silicon oxide film, into which ions are implanted at a low tilt angle, in a trench. When ions are implanted at a tilt angle as shown in FIG. 6A lower than the tilt angle shown in FIG. 5A, an implanted damaged region 34 may be formed in the portion of silicon oxide film 3 on the entire trench sidewall. Therefore, an undamaged region 35 is formed in the portion of silicon oxide film 3 on the trench bottom and undamaged region 35 is left as a residual oxide film 36 after the wet etching of silicon oxide film 3.

By appropriately adjusting the tilt angle between the incident ion beam and the trench depth direction (i.e. the vertical line) when damages are caused by Ar ion implantation, the shape of residual oxide film 33 or 36 may be changed.

Figure 7:
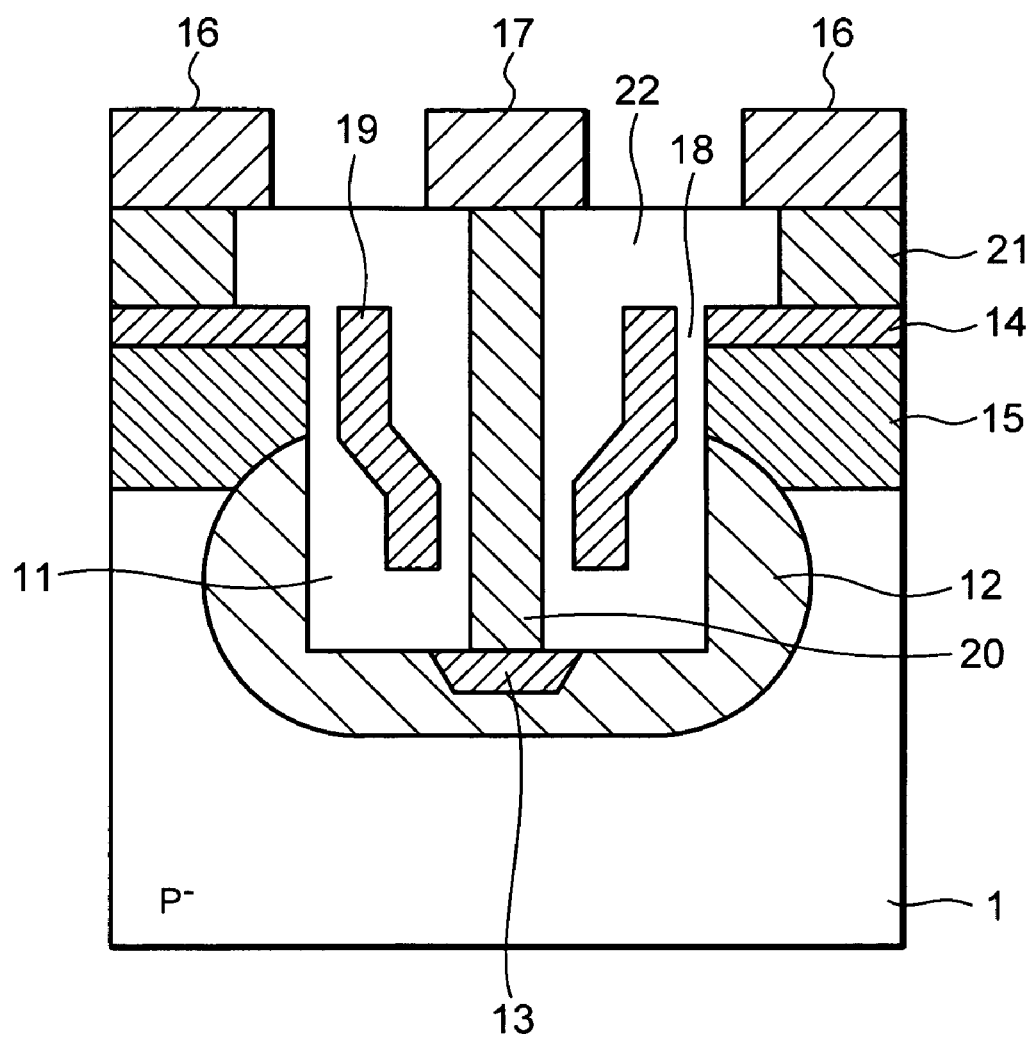
FIG. 7 is a cross-sectional view of a TLPM according to the invention.

FIG. 7 is a cross-sectional view of a TLPM according to the invention.

Referring now to FIG. 7, the TLPM according to the invention includes a p$^-$-type semiconductor substrate 1, a trench 11 formed from the surface of semiconductor substrate 1, an n-type drain region 12 around the sidewall and the bottom of trench 11, and an n-type plug region 13 in the bottom of trench 11. An n$^+$-type source region 14 is formed in a p-type offset region 15 around the upper portion of trench 11. The TLPM shown in FIG. 7 is different from the conventional TLPM shown in FIG. 9 in that al least the portion of the sidewall of trench 11 in contact with a gate oxide film 18 is flat and not expanding into semiconductor substrate 1.

Source electrodes 16 are around the aperture of trench 11. A drain electrode 17 is formed on the semiconductor surface between source electrodes 16. A polysilicon gate electrode 19 is formed in trench 11 such that gate electrode 19 is facing to p-type offset region 15 across a gate oxide film 18. A drain connection conductor 20 connecting n-type drain region 12 and drain electrode 17 is made of polysilicon. Gate electrode 19, drain connection conductor 20, and a source connection conductor 21 are insulated from each other by an insulator film 22 formed into a unit with gate oxide film 18.

Figure 8:
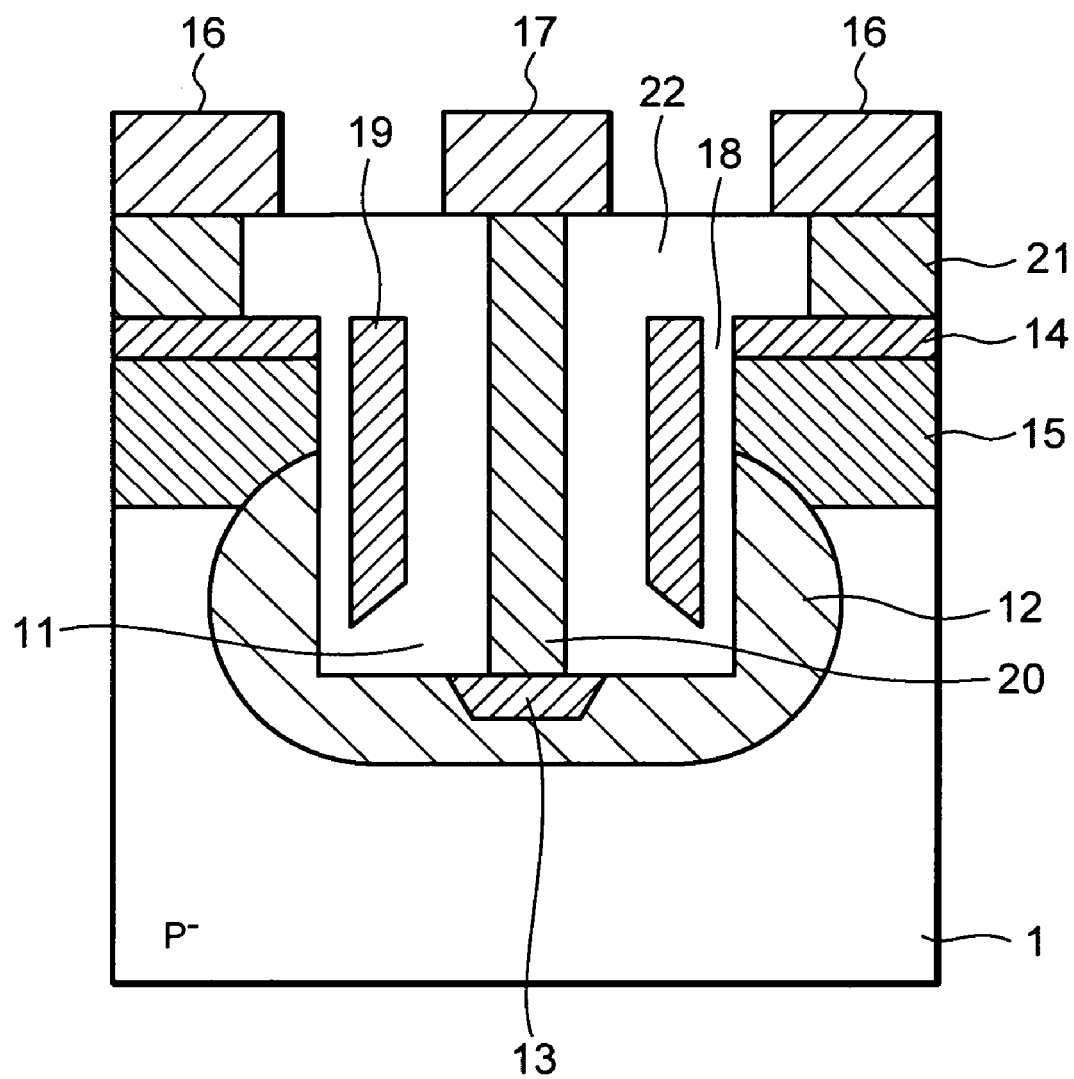
FIG. 8 is a cross-sectional view of another TLPM according to the invention.

FIG. 8 is a cross-sectional view of another TLPM according to the invention.

The TLPM shown in FIG. 8 is different from the TLPM shown in FIG. 7 only in the thickness of gate oxide film 18 interposed between gate electrode 19 and n-type drain region 12. In FIG. 7, residual oxide film 33, formed by leaving an oxide film not only on the bottom of trench 11 but also on the lower sidewall portion of trench 11, is utilized for forming gate oxide film 18. In contrast, residual oxide film 36 shown in FIG. 6(b) is utilized for forming gate oxide film 18 in FIG. 8.

Figure 9:
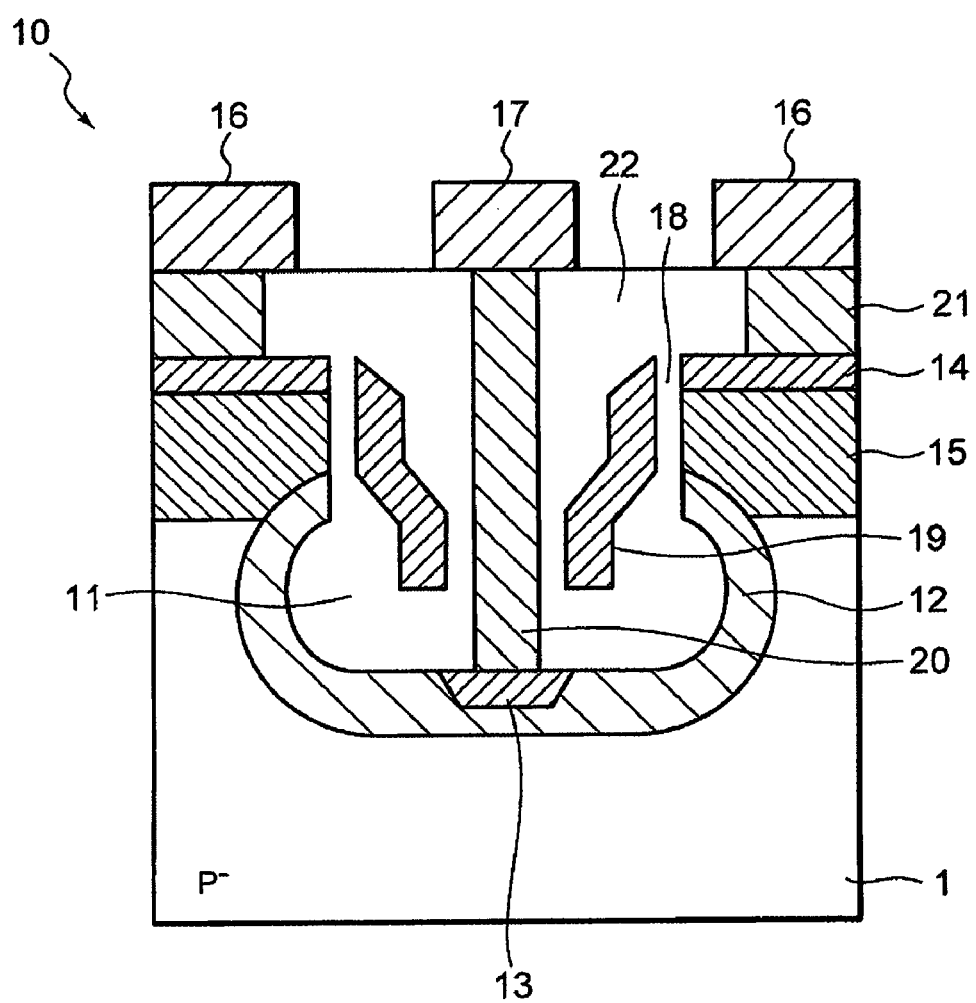
FIG. 9 is a cross-sectional view of a TLPM employing a conventional technique. according to the prior art.
Figure 10A:
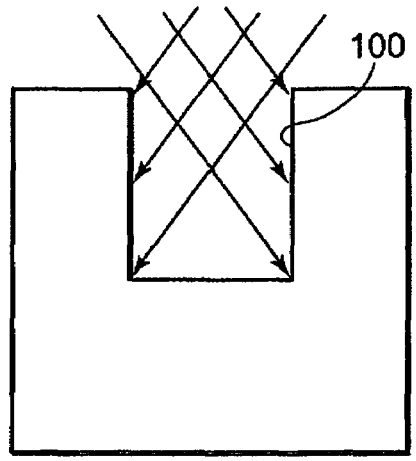
FIGS. 10A through 10C are cross-sectional views illustrating the steps for selectively forming an oxide film in a trench according to the prior art.
Figure 10B:
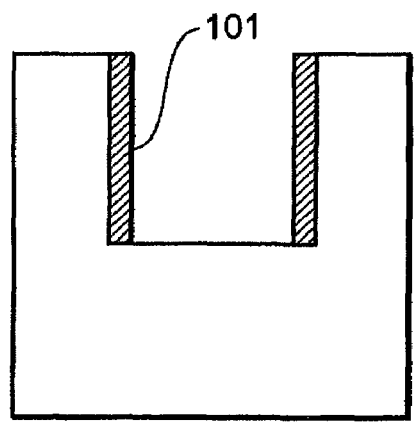
Figure 10C:
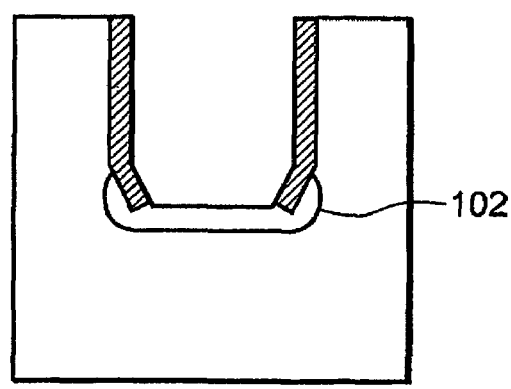
Figure 11A:
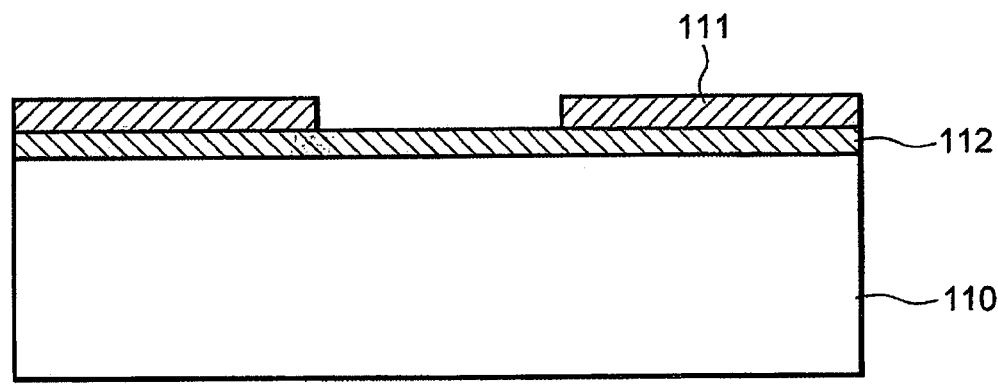
FIGS. 11A and 11B are cross-sectional views illustrating the steps of selective oxidation using a nitrogen-doped silicon film or a nitride film for an oxidation-resistive mask according to the prior art.
Figure 11B:
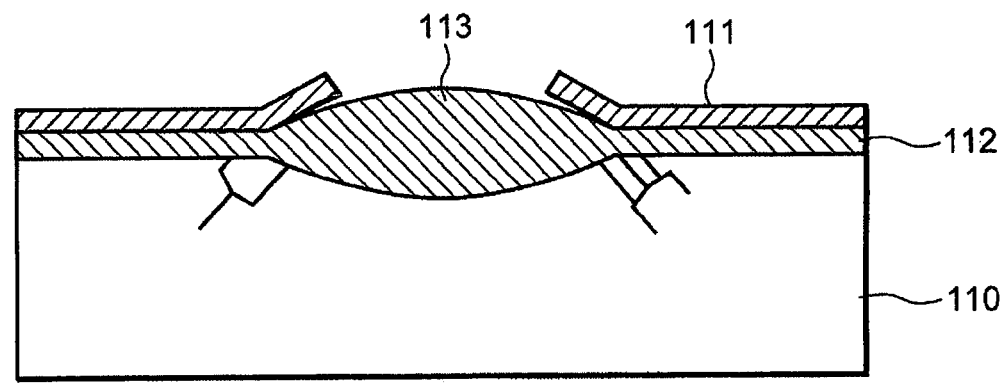

In the conventional TLPM shown in FIG. 9, stress and crystal defects are caused due to the LOCOS in the trench sidewall and the silicon in the trench sidewall may be affected adversely by the residual nitrogen. Moreover, unevenness due to the bird's beak may be caused in the trench sidewall. In contrast, stress and crystal defects are not caused due to the LOCOS in FIGS. 7 and 8. There exists no residual nitrogen in the trench sidewall in FIGS. 7 and 8. Therefore, it is possible to obtain a flat trench sidewall in FIGS. 7 and 8.

Since it is not necessary to form a thick thermal oxide film in the trench according to the invention, the stress and crystal defects due to thermal oxidation are prevented from causing as described above. Therefore, it is possible to manufacture trench-type devices, the characteristics and the reliability thereof are improved, according to the invention. It is also possible to leave a thick silicon oxide film only on the bottom of the trench or on the bottom of the trench and the lower sidewall portion of the trench by adjusting the angle between the vertical line and the ion beam such as an Ar ion beam (tilt angel) so that damages may be caused by oblique ion implantation selectively in the sidewall portion of the trench or only in the limited upper sidewall portion of the trench and by etching the semiconductor substrate with a hydrofluoric acid aqueous solution.

What is claimed is:

1. A method for manufacturing a semiconductor device, comprising the steps of:
    forming a trench having a bottom, sidewalls and an aperture in a semiconductor substrate;
    forming a gate insulator film on the bottom and the sidewalls of the trench, the gate insulator film comprising a silicon oxide film having a thickness; and
    removing at least partially a portion of the gate insulator film on the sidewalls of the trench near the aperture thereof so as to selectively reduce the thickness of the portion of the gate insulator film on the sidewalls of the trench near the aperture thereof, the step of removing being comprised of:
        a first step of forming an ion implanted damaged region locally in the gate insulator film in which ions are implanted into the exposed gate insulator film, and
        a second step of removing the gate insulator film from the ion implanted damaged region selectively.

2. The method according to claim 1, wherein the step of forming a gate insulator film comprises forming a high-temperature oxide film (HTO) by low pressure chemical vapor deposition (LP-CVD).

3. The method according to claim 1, wherein the step of forming a gate insulator film comprises forming a TEOS film by low pressure chemical vapor deposition (LP-CVD).

4. The method according to claim 1, wherein the first step comprises irradiating a first ion implantation species at a predetermined incident angle to the silicon oxide film on the bottom and the sidewalls of the trench, the silicon oxide film having a predetermined thickness, whereby to form the ion implanted damaged region in the portion of the silicon oxide film on the sidewalls of the trench or locally in the portion of the silicon oxide film on the sidewalls of the trench near the aperture thereof.

5. The method according to claim 4, wherein the second step comprises etching the silicon oxide film utilizing the etching rate difference, in which the etching rate is faster in the ion implanted damaged region formed by implanting the first implantation species than in the undamaged region, whereby to leave the silicon oxide film to be thick on the bottom of the trench or to leave the silicon oxide film to be thick on the bottom of the trench and on the sidewalls of the trench near the bottom thereof.

6. The method according to claim 4, wherein the second step comprises etching the silicon oxide film with a hydrofluoric acid aqueous solution.

7. The method according to claim 4, wherein the first ion implantation species comprises inert gas ions.

8. The method according to claim 4, wherein the first ion implantation species comprises ions of rare gas atoms including argon ions.

9. The method according to claim 4, wherein the first implantation species comprises ions of halogen atoms.

10. A method for manufacturing a semiconductor device, comprising the steps of:

forming a trench having a bottom, sidewalls and an aperture in a semiconductor substrate;

forming a gate insulator film on the bottom and the sidewalls of the trench, the gate insulator film comprising a silicon oxide film having a thickness; and removing at least partially a portion of the gate insulator film on the sidewalls of the trench near the aperture thereof so as to selectively reduce the thickness of the portion of the gate insulator film on the sidewalls of the trench near the aperture thereof, the step of removing being comprised of:

a first step of forming an ion implanted damaged region locally in at least a portion of the gate insulator film in the sidewalls of the trench, but not in the bottom of the trench, employing implantation ions which are halogen ions selected from the group consisting of fluorine, chlorine, bromine, and iodine and which are implanted into the exposed gate insulator film, and a second step of removing the gate insulator film from the ion implanted damaged region selectively.

11. The method according to claim 10, wherein the first step comprises irradiating a first ion implantation species at a predetermined incident angle to the silicon oxide film in at least a portion of the sidewalls of the trench but not in the bottom of the trench.

12. The method according to claim 10, wherein the second step comprises etching the silicon oxide film utilizing the etching rate difference, in which the etching rate is faster in the ion implanted damaged region formed by implanting the first implantation species than in the undamaged region, whereby to leave the silicon oxide film to be thick on the bottom of the trench or to leave the silicon oxide film to be thick on the bottom of the trench and on the sidewalls of the trench near the bottom thereof.

13. The method according to claim 10, wherein the second step comprises etching the silicon oxide film with a hydrofluoric acid aqueous solution.

* * * * *